United States Patent
Chanemougame et al.

(10) Patent No.: US 11,791,271 B2
(45) Date of Patent: Oct. 17, 2023

(54) MONOLITHIC FORMATION OF A SET OF INTERCONNECTS BELOW ACTIVE DEVICES

(71) Applicant: Tokyo Electron Limited, Tokyo (JP)

(72) Inventors: Daniel Chanemougame, Albany, NY (US); Lars Liebmann, Albany, NY (US); Jeffrey Smith, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 17/306,331

(22) Filed: May 3, 2021

(65) Prior Publication Data

US 2022/0102277 A1  Mar. 31, 2022

Related U.S. Application Data

(60) Provisional application No. 63/085,578, filed on Sep. 30, 2020.

(51) Int. Cl.
| | | |
|---|---|---|
| *H01L 23/538* | (2006.01) | |
| *H01L 21/48* | (2006.01) | |
| *H01L 27/092* | (2006.01) | |

(52) U.S. Cl.
CPC ...... *H01L 23/5383* (2013.01); *H01L 21/4885* (2013.01); *H01L 27/0924* (2013.01)

(58) Field of Classification Search
CPC ............ H01L 23/5383; H01L 21/4885; H01L 27/0924
See application file for complete search history.

(56) References Cited

U.S. PATENT DOCUMENTS

| | | | | |
|---|---|---|---|---|
| 4,527,325 | A  * | 7/1985 | Geipel, Jr. | ........ H01L 21/02164 |
| | | | | 257/376 |
| 10,256,158 | B1 * | 4/2019 | Frougier | ............... H01L 29/161 |
| 2003/0205768 | A1 * | 11/2003 | Wang | ...................... H01J 29/96 |
| | | | | 438/149 |
| 2004/0061163 | A1 * | 4/2004 | Nakayama | ............ H01L 27/088 |
| | | | | 257/E29.174 |
| 2017/0324015 | A1 * | 11/2017 | Mandal | .................. H10N 10/82 |
| 2019/0141830 | A1 * | 5/2019 | Takken | .................. H05K 13/04 |
| 2019/0189505 | A1 * | 6/2019 | Clendenning | ..... H01L 21/76832 |
| 2020/0286871 | A1 * | 9/2020 | Liff | ........................ G02B 6/125 |

* cited by examiner

*Primary Examiner* — Thao X Le
*Assistant Examiner* — Sean Ayers Winters
(74) *Attorney, Agent, or Firm* — Oblon, McClelland, Maier & Neustadt, L.L.P.

(57) ABSTRACT

An additional set of interconnects is created in bulk material, allowing connections to active devices to be made from both above and below. The interconnects below the active devices can form a power distribution network, and the interconnects above the active devices can form a signaling network. Various accommodations can be made to suit different applications, such as encapsulating buried elements, using sacrificial material, and replacing the bulk material with a dielectric. Epitaxial material can be used throughout the formation process, allowing for the creation of a monolithic substrate.

7 Claims, 9 Drawing Sheets

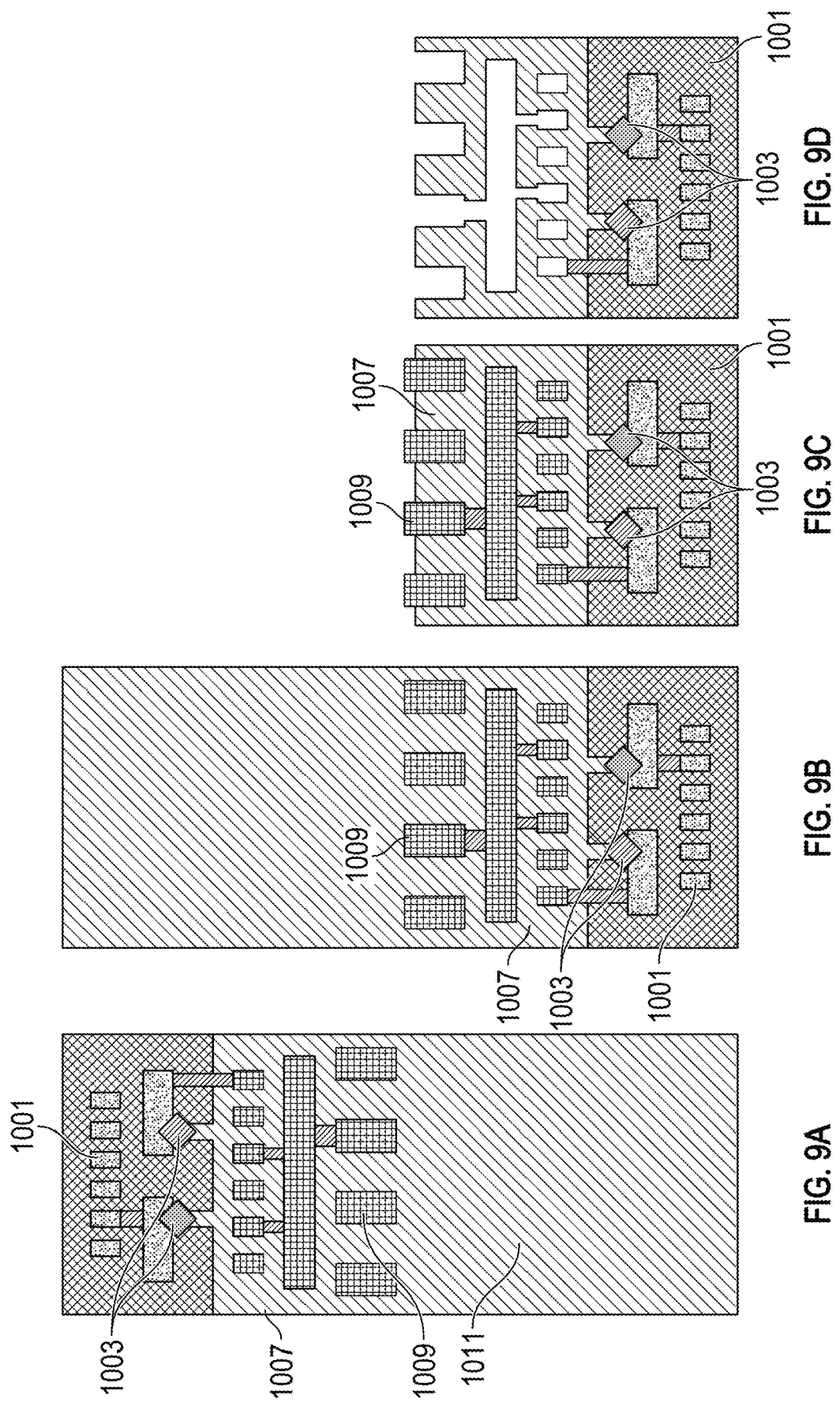

MONOLITHIC FORMATION OF A SET OF INTERCONNECTS BELOW ACTIVE DEVICES

CROSS REFERENCE TO CO-PENDING APPLICATION

This application claims priority to U.S. Provisional Patent Application No. 63/085,578 filed Sep. 30, 2020, the contents of which are incorporated herein by reference.

BACKGROUND

As traditional 2D scaling is showing a rapidly reduced return on investment, the semiconductor industry is looking to the $3^{rd}$ dimension to maintain node-to-node improvement in power-performance-area-cost (PPAC). One approach to continued scaling is using the vertical axis to add additional interconnect levels and/or move part of the interconnect levels below active CMOS devices. Active devices in an integrated circuit are typically located on the surface of the substrate, usually silicon, with interconnect levels built above, leaving the bulk of the substrate (below the active devices) unused.

In typical technologies, the ever increasing density of active devices on the top of the substrate, dictated by Moore's law, leads to very challenging congestion issues in the Back-End-Of-Line (BEOL) metal stack. Indeed, as devices got smaller, the dimensions of the BEOL did not maintain the same pace, due to drastically increasing parasitic resistance and capacitance. Devices need to be connected together to build the standard logic and memory circuits, which in turn must be connected together to build the ubiquitous modern and complex circuits. Part of these connectivity requirements includes, among other things, the power distribution network and clock signal tree. Both are fed from the very top of the BEOL stack (and beyond that, from the packaging level) and must reach all the way down to the active devices. Each of these actively consumes BEOL metal levels resources such that the required density of connectivity and the BEOL scaling shortcomings lead to congestion issues of the BEOL metal levels, which ultimately leading to sub-optimal power, performance and density solutions.

SUMMARY

The present disclosure is related to a method of fabrication, the method comprising: providing a substrate, the substrate comprising bulk semiconductor material; forming an opening in the bulk semiconductor material patterned for a first wiring structure; filling the opening in the bulk semiconductor material with metal such that the first wiring structure is formed at least partially within the bulk semiconductor material; epitaxially growing active semiconductor material over the first wiring structure; forming one or more active devices in the active semiconductor material over the first wiring structure; and forming a second wiring structure over the one or more active devices.

One embodiment further comprises capping the metal with dielectric prior to epitaxially growing the active semiconductor material.

In one embodiment, the filling the opening comprises: filling the opening with sacrificial material; accessing the first wiring structure from a backside of the substrate; and replacing the sacrificial material with the metal.

One embodiment further comprises replacing the bulk semiconductor material with an insulating material that surrounds the metal.

In one embodiment, the forming one or more active devices comprises forming one or more of a FINFET device, a CFET device and a nanosheet device in the active semiconductor material.

In one embodiment, the first wiring structure includes a power delivery network and the second wiring structure includes a signaling network.

In one embodiment, the bulk semiconductor material and the active semiconductor material form a monocrystalline structure. In another embodiment, the bulk semiconductor material is silicon and the active semiconductor material is silicon.

In one embodiment, the first wiring structure comprises a plurality of wiring layers, the method further comprising: forming a first layer of the first wiring structure within the bulk semiconductor material; epitaxially growing additional semiconductor material over the first wiring layer; and forming a subsequent layer of the first wiring structure within the additional semiconductor material.

One embodiment further comprises repeating steps of epitaxially growing additional semiconductor material and forming a subsequent layer of the first wiring structure within the additional semiconductor material until completing a predetermined number of wiring layers for the first wiring structure.

One embodiment further comprises insulating the openings with dielectric prior to the filling the openings with metal.

One embodiment further comprises a) forming the first wiring structure as a multilayer fan-in wiring structure, and b) forming the second wiring structure as a multilayer fan-out structure.

In one embodiment, a largest critical dimension within the first and second wiring structures is no greater than 50 nm.

The present disclosure is also related to a system comprising a monolithic substrate comprising: a first wiring structure formed within bulk material of a semiconductor wafer; one or more active devices formed in an epitaxially grown semiconductor material above the first wiring structure; and; a second wiring structure formed above the one or more active devices.

In one embodiment, the first wiring structure includes a power delivery network and the second wiring structure includes a signal network.

In one embodiment, the bulk material is silicon and the epitaxially grown semiconductor material is silicon.

In one embodiment, the first wiring structure is a multilayer fan-in wiring structure, and the second wiring structure is a multilayer fan-out wiring structure.

In one embodiment, a largest critical dimension within the first and second wiring structure is no greater than 50 nm.

In one embodiment, the one or more active devices comprises one or more of a FINFET device, a CFET device and a side-by-side nanosheet device in the epitaxially grown semiconductor material.

In one embodiment, the first wiring structure is metal, and the metal is capped with a dielectric.

BRIEF DESCRIPTION OF DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 9A-FIG. 9G illustrate process steps of forming interconnects in a bulk material, according one embodiment of the present disclosure.

DETAILED DESCRIPTION

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Figure 1:
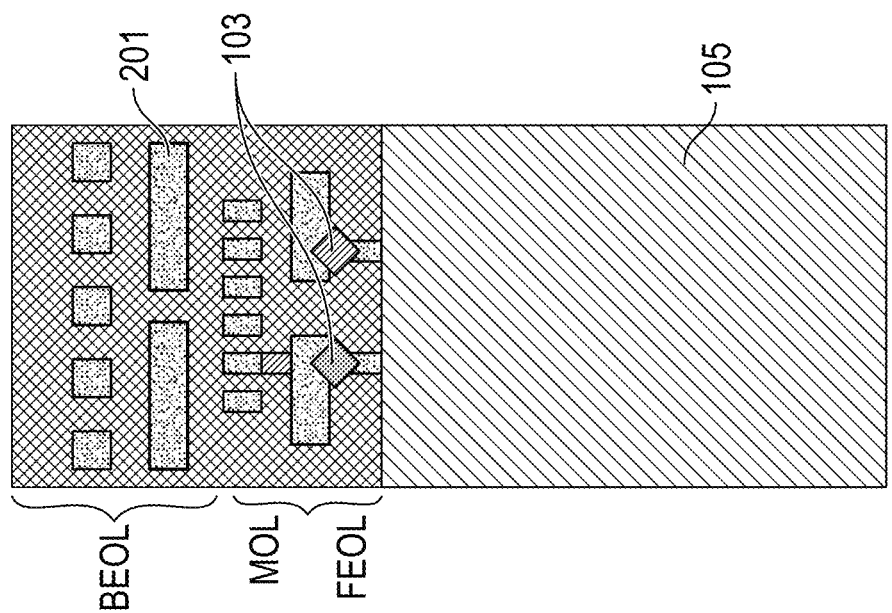
FIG. 1 shows a conventional electronic device without interconnects in the bulk material, according one embodiment of the present disclosure.

The present disclosure is related to monolithic formation of a set of interconnects below active devices. FIG. 1 show an example of a typical electronic device, where active devices 103 are built above the bulk material 105, and a wiring structure 201 built above the active devices 103 interconnects the active devices 103. This disclosure is related to functionalizing the bulk material 105 with metal interconnects (i.e. another interconnected wiring structure below the active device 103) and non-core devices. Unlike other methods using wafer to wafer bonding, this disclosure enables use of a single wafer, thereby avoiding issues associated with having to precisely combine two wafers together. A first set of operations realizes the buried elements in the bulk material 105 and provides a final top layer, on which typical active devices 103 are built by a conventional second set of operations (FEOL, middle-of-the-line (MOL) and BEOL). In other words, active devices are built in a conventional way on a wafer that already contains a set of buried elements.

Functionalizing the bulk material with extra metal layers would enable sharing the connectivity burden of the top side conventional interconnects, and significantly reducing its congestion. In one embodiment, the functional substrate metal resources could be used to route the power distribution network and clock tree, leaving the top side interconnect fully available for signal routing. Functional substrate metal resources could also be used for signal routing to further relieve congestion on the top side.

In one embodiment, this disclosure is related to a system comprising: a first wiring structure formed within bulk material of a semiconductor wafer; one or more active devices formed above the first wiring structure; and a second wiring structure formed above the one or more active devices.

Figure 2:
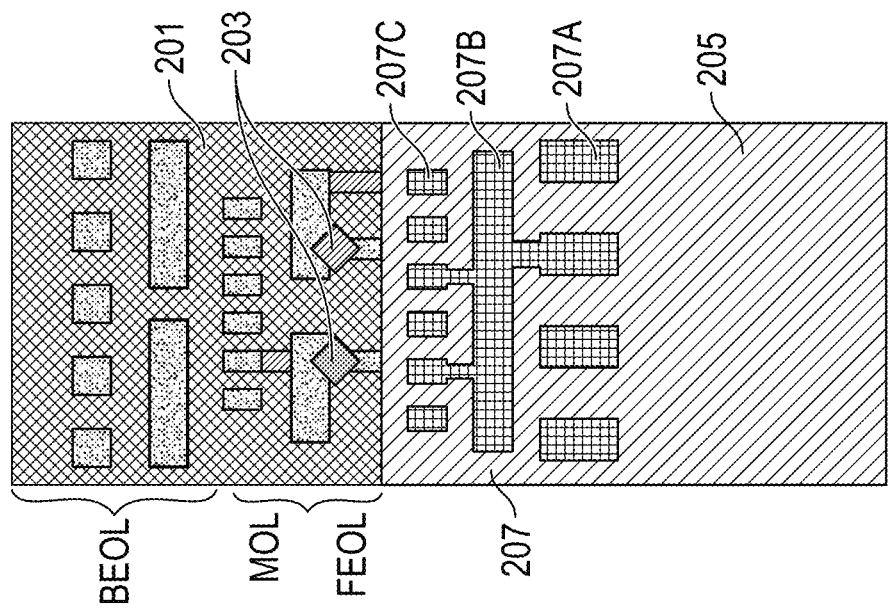
FIG. 2 shows a system having interconnects in the bulk material, according one embodiment of the present disclosure.

FIG. 2 shows an example of one such system. The first wiring structure 207, having a first layer 207A, second layer 207B, and third layer 207C of interconnects, is formed within bulk material 205, such as silicon. The bulk material can include epitaxially grown material that is of the same material as the bulk material 205 to form a monocrystalline structure. There is a plane of active devices 203 above the first wiring structure 207, and a second wiring structure 201 is above the plane of active devices 203. The metal lines for each layer are orthogonal to the metal lines in the layers above and/or below. The pitch fans in, with the first layer 207A having the widest pitch, and the third layer 207C having the narrowest pitch.

In one embodiment, the first wiring structure 207 includes a power delivery network, clock tree, signal routing, or any combination thereof. In another embodiment, the second wiring structure 201 includes a signal network. In another embodiment, the bulk material 205 is a low-k dielectric (e.g. fluorine-doped silicon dioxide, organosilicate glass) for reducing parasitic capacitance. In another embodiment, the patterns of the first wiring structure 207 formed in the bulk material 205 have a critical dimension distance between approximately 10-50 nanometers. The active devices 203 can be any type of active device, such as a finFET or complementary FET (CFET).

This disclosure also presents methods for monolithic substrate formation and functionalization. It can be appreciated that the products created by the methods discussed herein can be viewed as a system.

Figure 3:
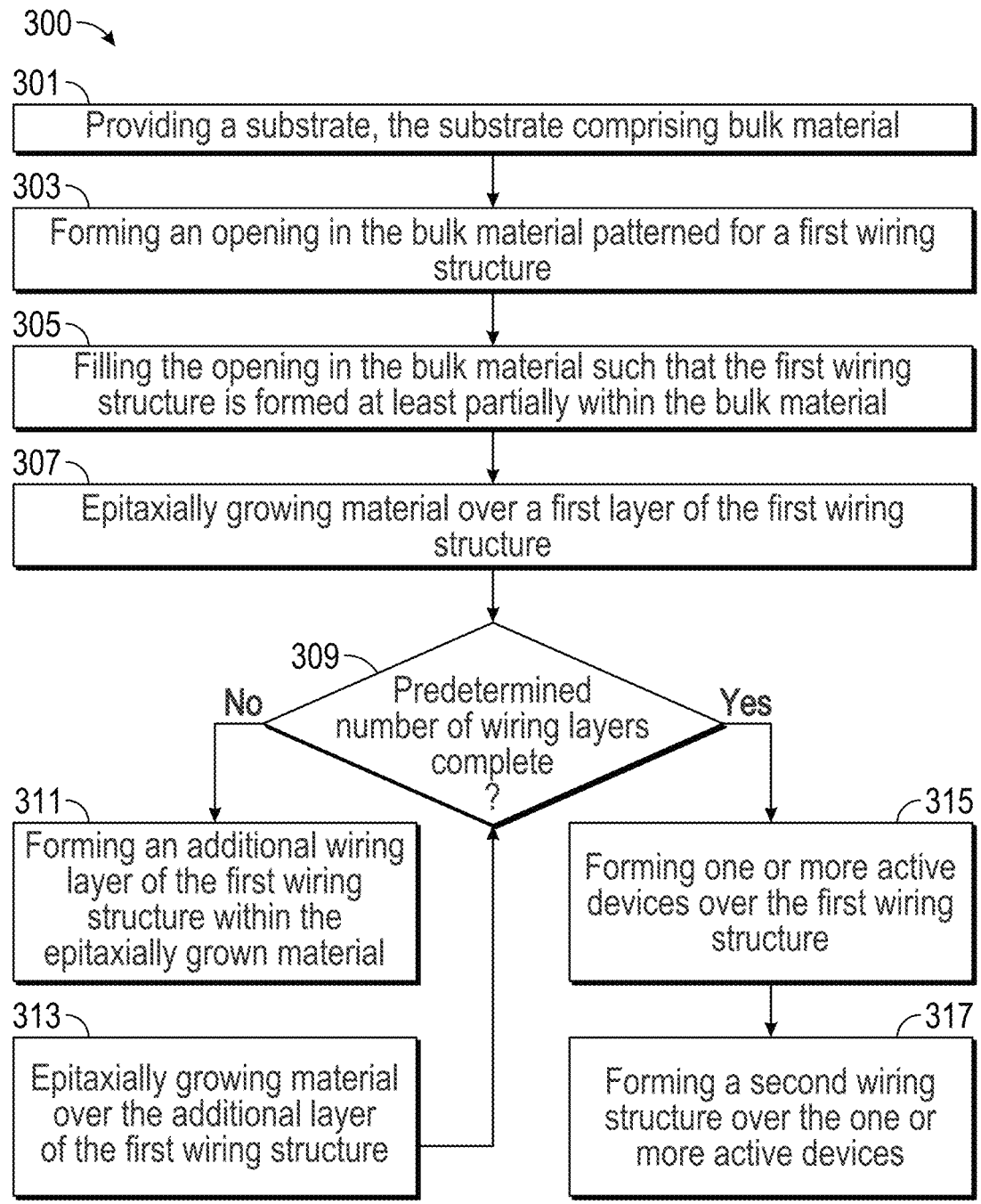
FIG. 3 is a flowchart of a first method for forming a system with interconnect levels built below active devices, according one embodiment of the present disclosure.

FIG. 3 is a flowchart of a method 300 according to an embodiment. FIG. 2, FIGS. 4A-4G, and FIG. 5A-5B will also be referenced during discussion of method 300 to help visualize the various steps.

Figure 4A:
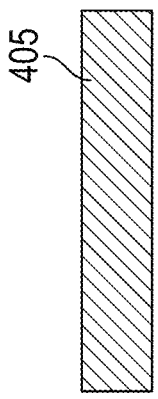
FIG. 4A-FIG. 4G illustrate process steps of forming interconnects in a bulk material, according one embodiment of the present disclosure.

Step 301 is providing a substrate, the substrate comprising bulk material. The bulk material can be any known semiconductor material, such as silicon, germanium, and gallium arsenide. An example of step 301 is shown in FIG. 4A, where a substrate comprising bulk silicon 405 is provided.

Figure 4B:
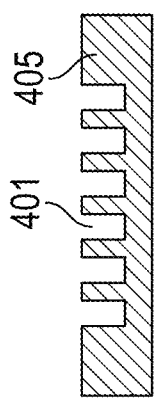

Referring back to FIG. 3, step 303 is forming an opening in the bulk material patterned for a first wiring structure. For example, the openings can include forming trenches and vias. If the first wiring structure has multiple layers, the bottom-most layer can be patterned in step 303. Any patterning technique can be used (e.g. etching), as appreciated by one of skill in the art. An example of step 303 is shown in FIG. 4B, where openings 401 for a pattern of one layer of the first wiring structure are formed in the bulk silicon 405.

Figure 4C:
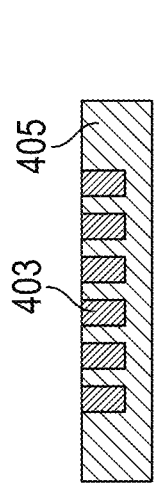

Step 305 of method 300 is filling the opening in the bulk material such that the first wiring structure is formed at least partially within the bulk material. In one embodiment, a conductive material, such as metal is used as the buried element for the filling. Examples of metals that can be used include ruthenium and tungsten. An example of step 305 is shown in FIG. 4C, where metal 403 fills the opening 401 in the bulk silicon 405 to form a first layer of the first wiring structure.

Figure 4D:
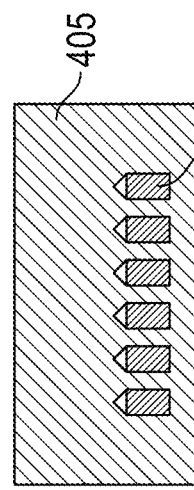
Figure 4E:
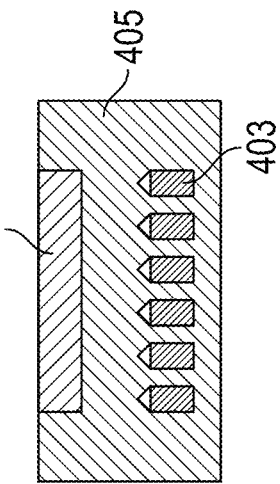

Step 307 of method 300 is epitaxially growing material over a first layer of the first wiring structure. The epitaxially grown material can be the same as the bulk material, and be grown directly on the bulk material to maintain a monocrystalline structure. For example, a silicon epitaxy process can be executed over silicon bulk material to encapsulate the filling (e.g. metal) and provide a fresh building ground on a monocrystalline structure. Using selective epitaxy, there will be no growth on the patterned features, which can create air gaps above the metal. Gaps above the buried elements can be closed by lateral epitaxy fronts growing from each side. In one embodiment, the critical dimension of adjacent openings created for the first wiring structure is between approximately 10 to 50 nanometers, which can help ensure that the gaps above the fillings can be closed by lateral epitaxy. An example of step 307 is shown in FIG. 4D and FIG. 4E, where silicon is epitaxially grown on bulk silicon to provide a fresh building ground. FIG. 4D shows the point when lateral silicon epitaxy has just closed the gaps above the metal 403, and FIG. 4E shows further growth of additional silicon epitaxy to create the fresh building ground.

Step 309 of method 300 determines whether a predetermined number of wiring layers have been completed. The predetermined number can correspond to the number of layers in the first wiring structure. Thus far, steps 301 through 307 have formed one layer of the first wiring structure. If the first wiring structure only has one layer, then the predetermined number of wiring layers is complete, and step 315 can be performed. If the first wiring structure has more than one layer, the predetermined number of wiring layers is not complete, and step 311 is performed.

Figure 4F:
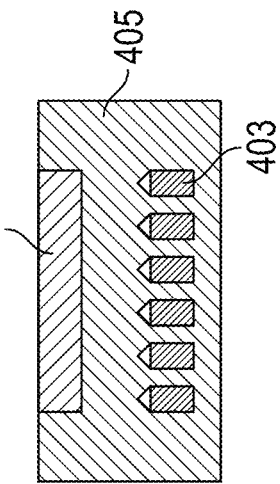

Step 311 of method 300 is forming an additional wiring layer of the first wiring structure within the epitaxially grown material from step 307. For example, if the first layer of the first wiring structure has been built, step 311 is forming the second layer of the first wiring structure. Forming an additional wiring layer includes forming openings corresponding to the additional wiring layer, and filling the openings. An example of step 311 is shown in FIG. 4F, where a second wiring layer of metal 407 is formed in the bulk silicon 405 above the metal 403 making up the first layer. The second wiring layer metal 407 and is orthogonal to the metal 403 in the first wiring layer.

Figure 4G:
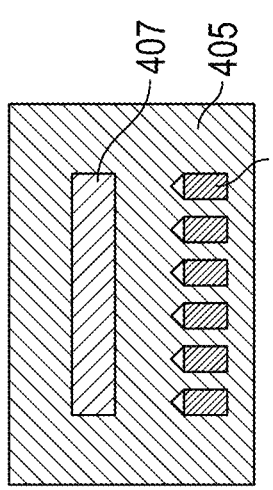

Step 313 of method 300 is epitaxially growing material over the additional layer of the first wiring structure. Similar to step 307, epitaxy is used to encapsulate the additional wiring layer formed in step 311. An example of step 313 is shown in FIG. 4G, where silicon epitaxy is grown over the second wiring layer metal 407.

After step 313 of method 300, step 309 is performed once again. Thus far, two layers of the first wiring structure have been formed in the bulk material. If there are additional layers to be formed, step 311 and step 313 are repeated until each layer of the first wiring structure has been formed. Once all the layer have been formed, step 315 is performed.

Once the predetermined number of wiring layers have been formed, step 315 is forming one or more active devices over the first wiring structure. Conventional processing can be used for forming any active devices, such as finFET or nanosheet (or CFET). Because there is no thick bonding oxide between the functional substrate and the active devices, optical alignment between the active devices and the functional substrate is conventional and therefore precise. In wafer to wafer bonding, thick bonding oxide can make alignment difficult.

Figure 5B:
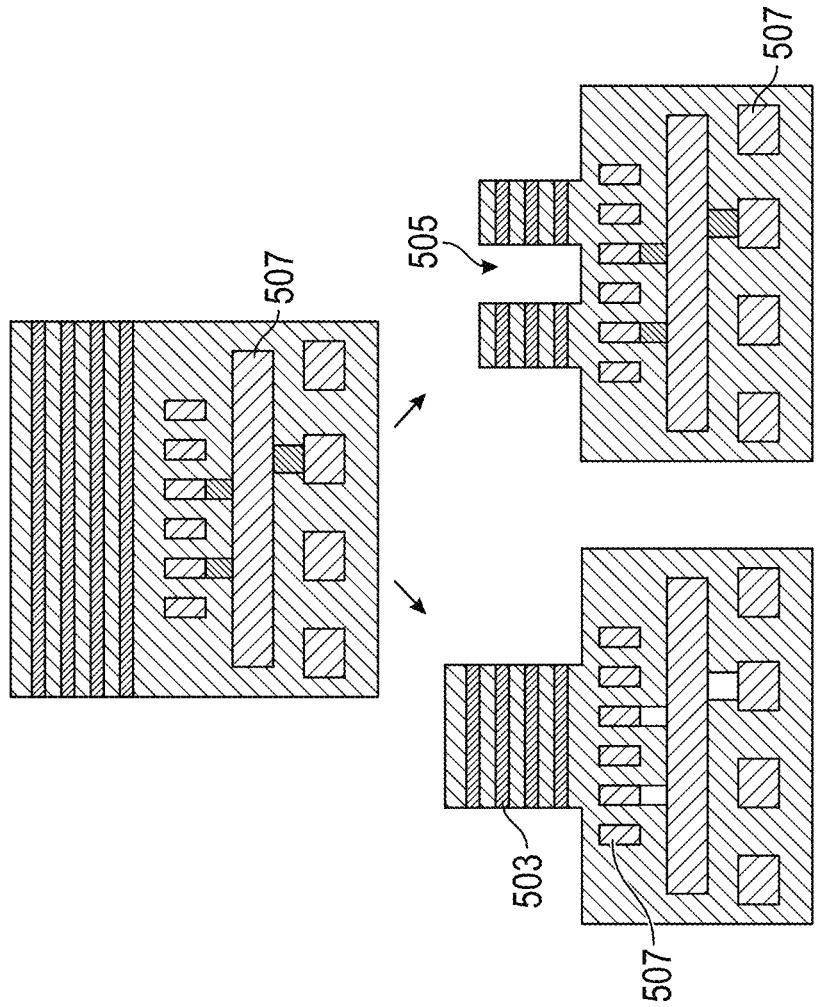
FIG. 5A and FIG. 5B illustrate forming active devices above interconnects formed in bulk material, according one embodiment of the present disclosure.
Figure 5A:
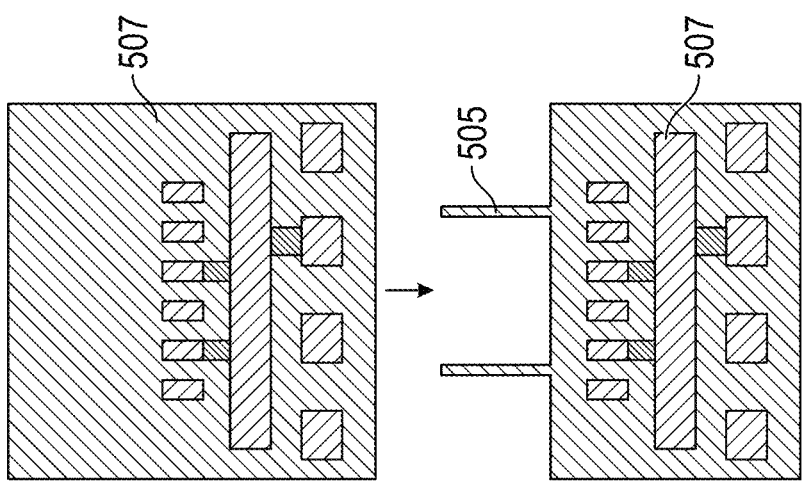

An example of step 315 is shown in FIG. 5A and FIG. 5B. After constructing the first wiring structure within bulk silicon, an active stack of any style is grown using silicon epitaxy. In FIG. 5A, during FEOL a finFET 501 is formed on silicon epitaxy above the first wiring structure 507 similar to FEOL on a blank wafer. In FIG. 5B, a CFET 503 and side by side nanosheet 505 are formed above the first wiring structure 507.

Step 317 of method 300 is forming a second wiring structure over the one or more active devices formed in step 315. The second wiring structure provides additional interconnects to the one or more active devices. An example of a second wiring structure formed over one or more active devices is shown in FIG. 2. In one instance, the second wiring structure 201 provides signal interconnects for the active devices 203, and the first wiring structure 207 provides power distribution interconnects for the active devices 203.

Figure 6:
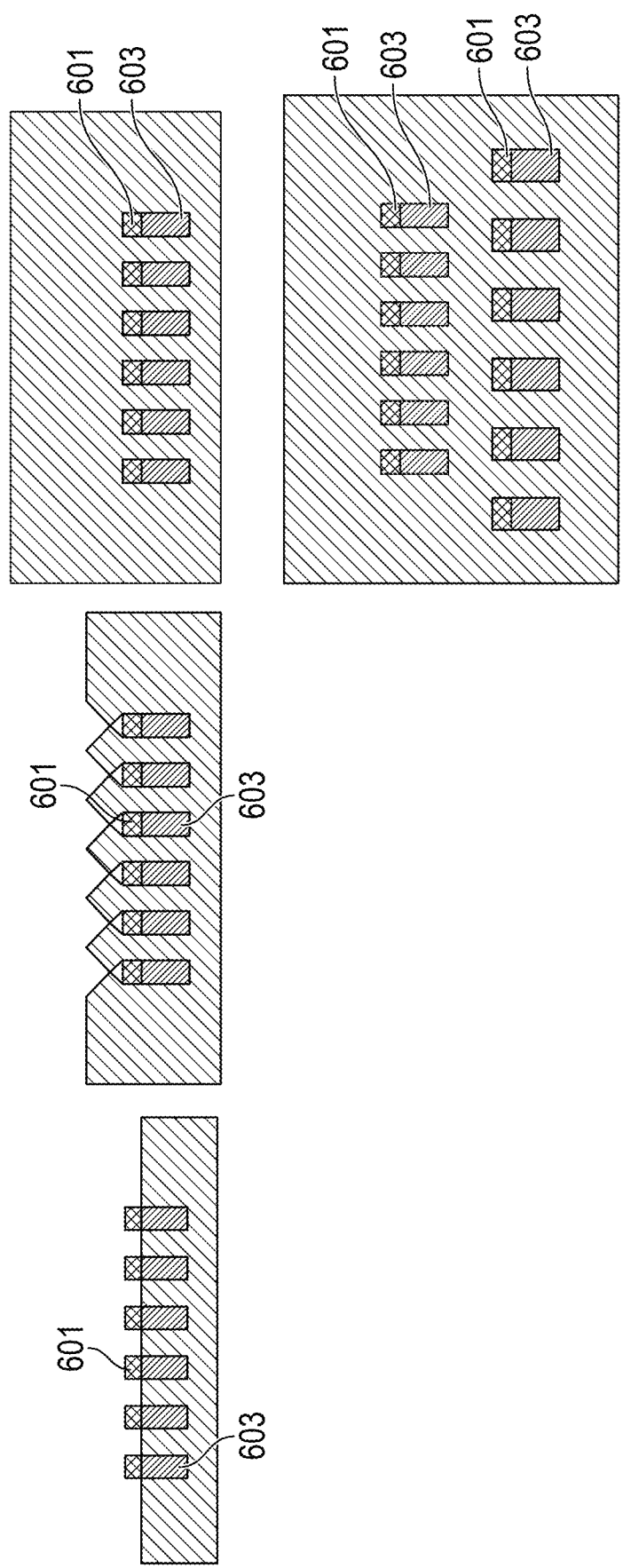
FIG. 6 illustrates the concept of capping a material with dielectric, according one embodiment of the present disclosure.

In one embodiment, when metal is used for the filling of the openings, these metal lines can be encapsulated to prevent contamination of the epitaxy chamber by depositing an oxide selectively on the metal, such as $AlO2+SiO_2$. Additionally, if the epitaxy chamber is dedicated to such incoming structures, contamination issues can be managed. An example of this is shown in FIG. 6, where a dielectric capping layer 601 is selectively deposited on top of metal 603. The dielectric capping layer 601 remains above the metal 603 through the various process steps illustrated in FIG. 6. Epitaxy will not grow on the dielectric caps. In one embodiment, this capping can be performed between steps 305 and 307, and between steps 311 and 313 of method 300.

Figure 7:
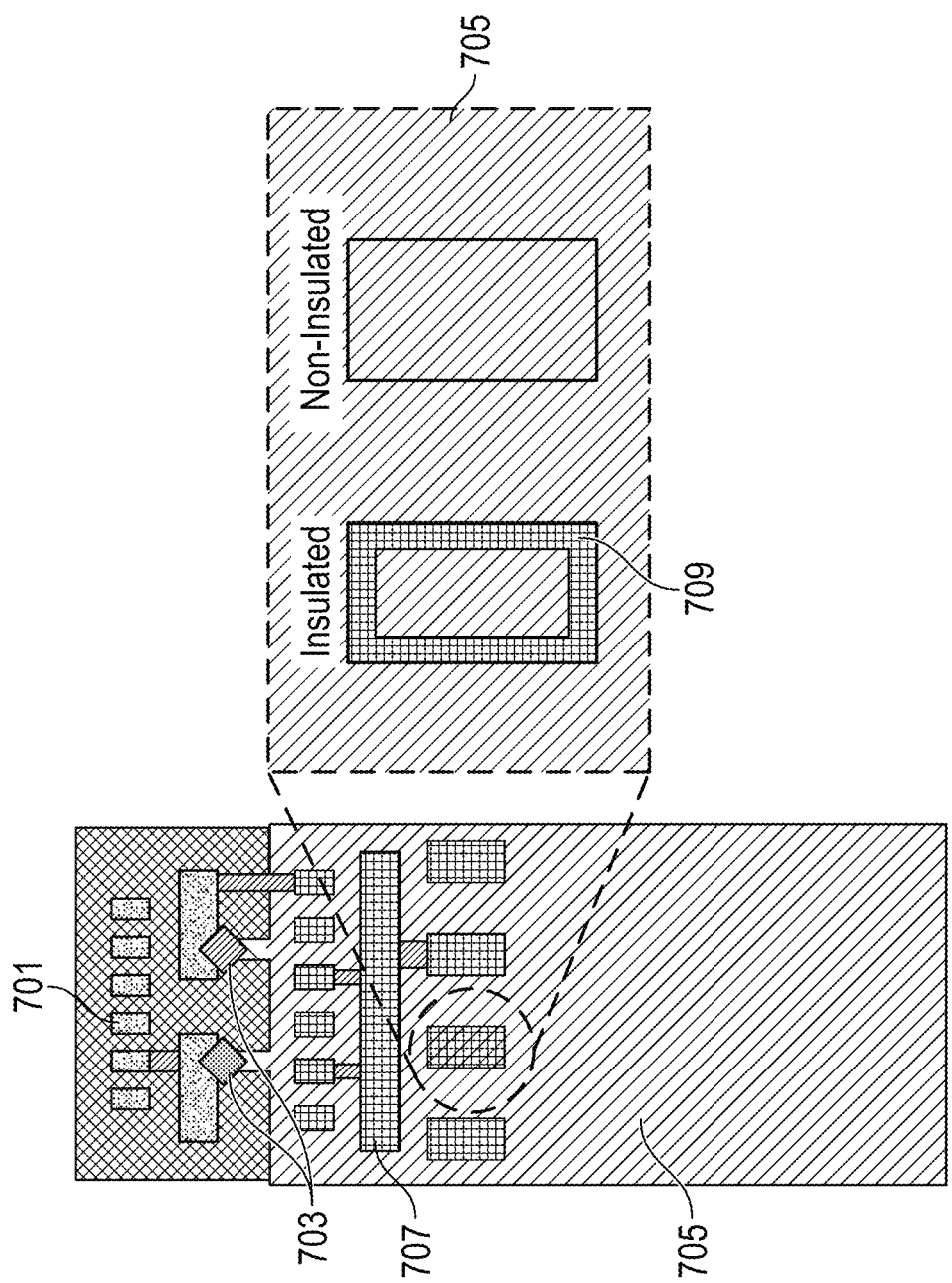
FIG. 7 is used to illustrated the concept of insulating non-insulated interconnects below the active devices, according one embodiment of the present disclosure.

In one embodiment, the openings formed in the bulk material can be insulated to prevent metal from touching the bulk material. FIG. 7 shows a simplified view of a final structure in which transistor devices 703 are connected to both top side interconnects 701 (i.e. second wiring structure) and non-insulated buried interconnects 707 (i.e. first wiring structure) of the bulk material 705. When non-insulated, the metal in the non-insulated buried interconnects 707 is touching the bulk material 705, which can increase parasitic capacitance. If this contact is not desirable, it can be avoided by selectively adding insulation 709 around the metal to form an insulated buried interconnect. This can include depositing a dielectric layer in the opening, followed by conventional trench metallization. Subsequently a dielectric capping layer is formed on top of the metal as explained above.

Another way to avoid increased parasitic capacitance is by replacing the bulk material with a low-k dielectric. For example, after step 317 of method 300, additional steps can be performed to remove and replace the bulk material surrounding the first wiring structure with a new dielectric having a lower k-value.

As previously mentioned, when insulation is not used, metal interconnects in the bulk material can increase parasitic capacitances. In one scenario, an increased parasitic capacitance can be used advantageously by selecting a particular type of interconnect, such as a power delivery network. The high parasitic capacitances can act as decoupling capacitances. A decoupling capacitance is a fundamental power distribution network element where the charges stored in the capacitances are available for the active devices' operation at high frequency. For hungry devices of modern chips, the amount of charges needed is quite large, meaning decoupling capacitors must be large in size or storage capacity. In conventional technology, decoupling capacitors are built in all the different stages of the power distribution network: at chip level in the BEOL (metal-insulator-metal caps) and at the package and printed circuit board levels. From BEOL to package and printed circuit board, decoupling capacitor capacity grows quite a bit: very small in BEOL and very large on the PCB, as large capacitors take a lot of space/area/volume.

But if the charges are too far away in the stack, they will not reach the active devices in time, therefore limiting high frequency operation. The proximity of large decoupling capacitors to the devices is critical to enable high frequency operation.

Therefore, if the substrate interconnects are dedicated to the power distribution network, much larger decoupling capacitors can be available in very close proximity to the active devices without adding masks or process steps.

As can be appreciated, many other embodiments are contemplated herein. For example, conventional BEOL metal interconnects are formed in the dielectric layers deposited on top of the active devices. This is by construction and has the benefit to reduce parasitic capacitances and eliminate any potential current leakage path between one metal line and the other.

Figure 8:
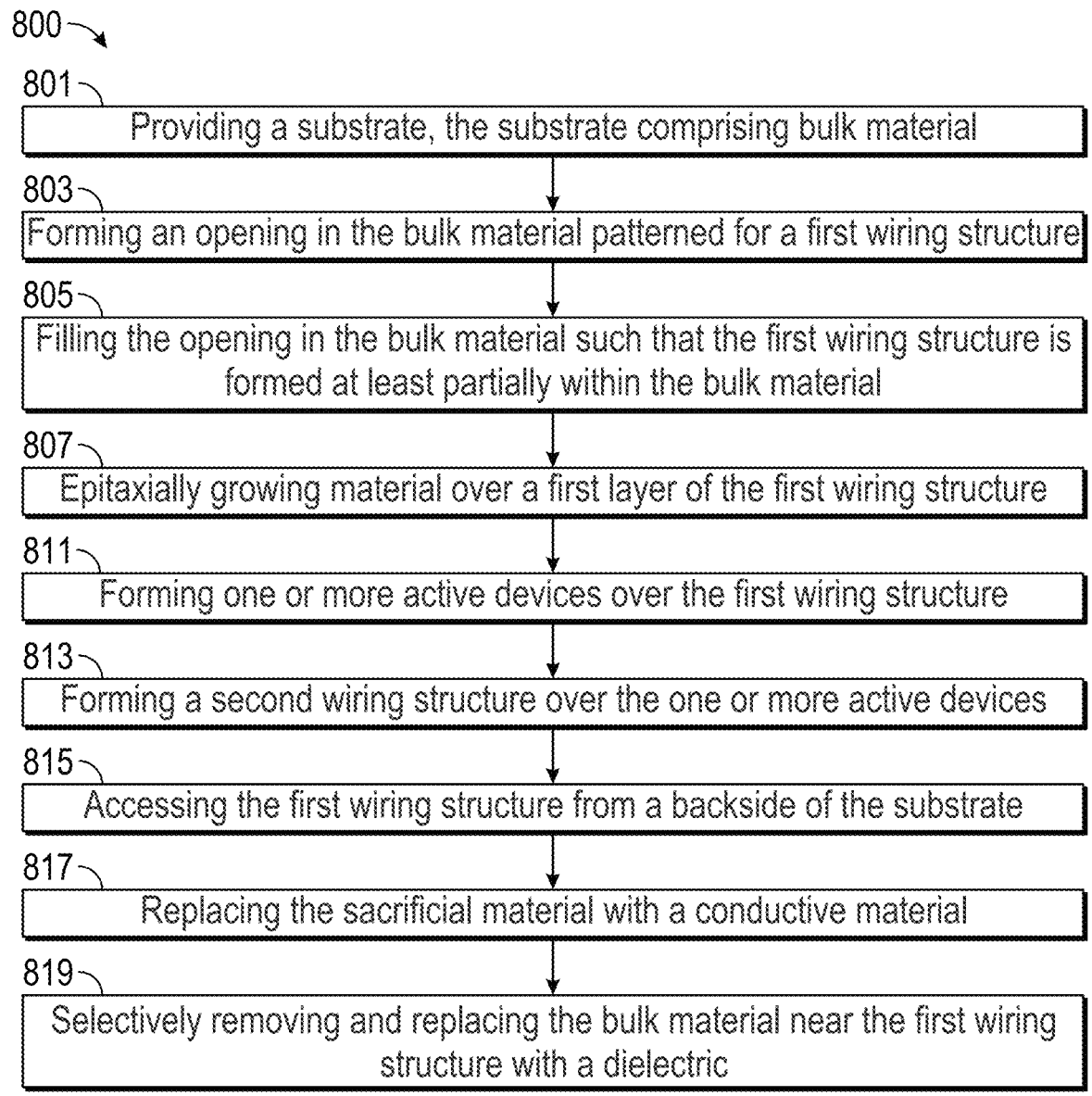
FIG. 8 is flowchart of a second method for forming a system with interconnect levels built below active devices, according one embodiment of the present disclosure.

FIG. 8 is a flowchart of another method 800. Method 800 is similar to method 300 but differs in a few aspects, including the use of sacrificial material to initially fill the openings. FIG. 9A-9G will be used to help illustrate the various steps discussed in method 800.

Step 801 of method 800 is providing a substrate, the substrate comprising bulk material. Step 803 is forming an opening in the bulk material patterned for a first wiring structure. Steps 801 and 803 are the same as steps 301 and 303 of method 300 respectively, discussed above.

Step 805 is filling the opening in the bulk material such that the first wiring structure is formed at least partially within the bulk material. Unlike step 305 of method 300, which used metal to fill the openings, sacrificial material is used to fill the openings. Examples of sacrificial materials that can be used include amorphous silicon, amorphous carbon silicon oxides, and silicon nitrides. The sacrificial materials function as a placeholder that will be later replaced with a final metallization. Conventional etch back and chemical-mechanical planarization (CMP) processes can be used to planarize, or bottom-up deposition methods can alternatively be used.

Step 807 is epitaxially growing material over a first layer of the first wiring structure. Step 807 is the same as step 307 of method 300. Using selective epitaxy, there will be no growth on the patterned features. Air gaps above the patterned feature can be present or removed.

In this embodiment, for the sake of simplicity, the first wiring structure only has one layer. In instances where the first wiring structure has additional layers, the steps of forming an additional wiring layer of the first wiring structure within the epitaxially grown material, and epitaxially growing material over the additional layer of the first wiring structure until all the layers of the first wiring structure have been formed can be repeated, as was the case in steps 309, 311, and 313 of method 300.

Step 811 is forming one or more active devices over the first wiring structure. Step 811 is the same as step 315 of method 300. Step 813 is forming a second wiring structure over the one or more active devices. Step 813 is the same as step 317 of method 300.

FIG. 9A shows an example of a substrate that has been formed with sacrificial material 1009. The first wiring structure 1007, having three layers, has been formed in a monocrystalline structure 1011 comprising bulk silicon and epitaxially grown silicon, and connects to active devices 1003, the active devices 1003 also being connected to a second wiring structure 1001 located above the active devices 1003. The substrate shown in FIG. 9A is very similar to the substrate that can be formed using steps 801, 803, 805, 807, 811, and 813 of method 800, the difference being that the first wiring structure 1007 in FIG. 9A had three formed layers rather than one.

Returning back to FIG. 8, step 815 is accessing the first wiring structure from a backside of the substrate. The substrate can be flipped upside down for backside processing. Backside processing can be performed to grind and etch back the bulk material and partially expose the sacrificial material of the first interconnect layer. An example of step 815 is shown in FIG. 9B and FIG. 9C. In FIG. 9B, the substrate is flipped upside down. In FIG. 9C, the bulk silicon is grinded and etched back until the sacrificial material 1009 of first interconnect layer of the first wiring structure 1007 is partially exposed.

Figure 9G:
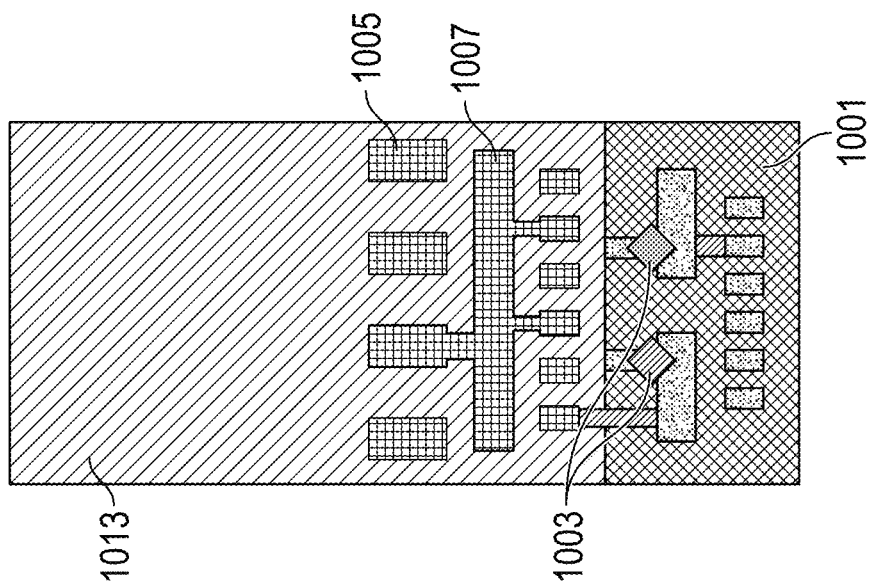
Figure 9F:
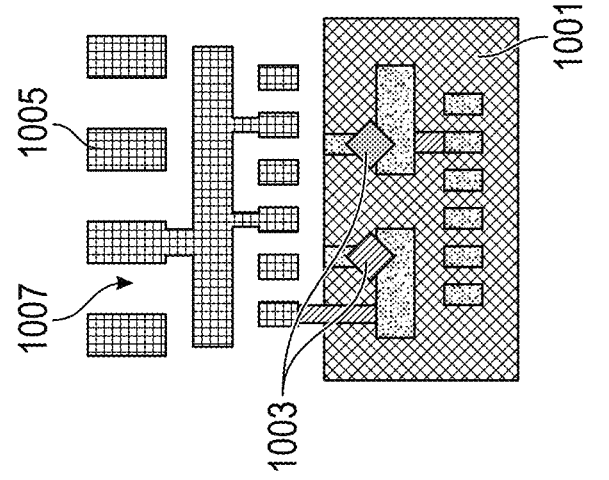
Figure 9E:
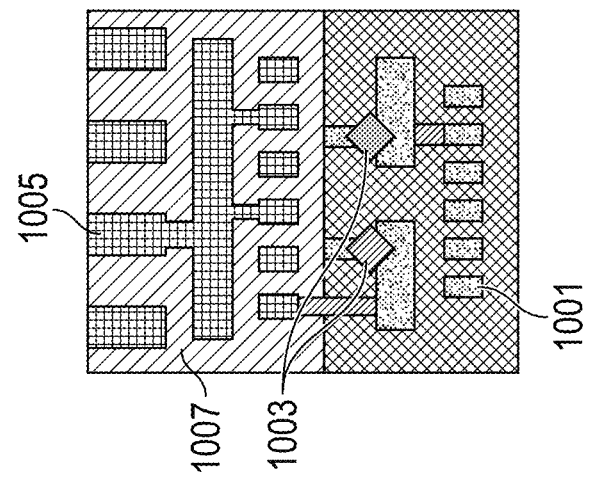

Returning back to FIG. 8, step 817 is replacing the sacrificial material with conductive material. The sacrificial material from all layers can be selectively removed (e.g. vapor phase, wet etch) through access provided by the partially exposed layer since there are no unconnected metal lines. Final metallization of all layers of the substrate can then be performed. All metal lines can be completely filled without pinching first openings through smaller openings provided by vias using advanced atomic layer deposition methods. Once metallization has been completed, through bottom-up approach, planarization (e.g. CMP) can be performed. An example of step 817 is shown in FIG. 9D and FIG. 9E. In FIG. 9D, sacrificial material in the first wiring structure is selectively removed through the partially exposed openings vapor phase or wet etch. In FIG. 9E, metallization is performed to fill the openings in the first wiring structure 1007, once filled with sacrificial material, with metal 1005. Non-refractory materials, such as copper, cobalt, and aluminum can be used.

Step 819 of method 800 is selectively removing and replacing the bulk material near the first wiring structure with a dielectric. The remaining bulk material can be selectively removed, revealing the metallic structure of the substrate interconnects. Low-k dielectric gap fill and planarization can then be executed. Additional back side processing can also be performed to further functionalize the substrate, such as adding power gating elements, voltage regulators, and decoupling capacitances. An example of step 819 is shown in FIG. 9F and FIG. 9G. In FIG. 9F, the remaining bulk silicon is removed, leaving the metal 1005 exposed. In FIG. 9G, low-k dielectric gap fill is performed to create a low-k dielectric 1013 surrounding the first wiring structure 1007. Since a lower-k dielectric is used, parasitic capacitance can be reduced. The substrate can be further functionalized, such as adding voltage regulators, decoupling capacitors, and power gating elements in the low-k dielectric 1013.

Accordingly, techniques herein significantly improve chip performance power and density by functionalizing the substrate and using a single wafer (no wafer to wafer bonding or stacked chips). The extra connectivity options herein, coupled with new interconnect levels below active devices, provides impactful reduction of routing congestion and complexity, as well as density scaling stagnation, as well as providing low resistance power delivery network by leveraging unused space and volume of the bulk substrate and the vertical dimension.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Embodiments of the present disclosure may also be as set forth in the following parentheticals.

(1) A method of fabrication, the method comprising: providing a substrate, the substrate comprising bulk semiconductor material; forming an opening in the bulk semiconductor material patterned for a first wiring structure; filling the opening in the bulk semiconductor material with metal such that the first wiring structure is formed at least partially within the bulk semiconductor material; epitaxially growing active semiconductor material over the first wiring structure; forming one or more active devices in the active semiconductor material over the first wiring structure; and forming a second wiring structure over the one or more active devices.

(2) The method (1), further comprising capping the metal with dielectric prior to epitaxially growing the active semiconductor material.

(3) The method of any (1) to (2), wherein the filling the opening comprises: filling the opening with sacrificial material; accessing the first wiring structure from a backside of the substrate; and replacing the sacrificial material with the metal.

(4) The method of any (1) to (3), further comprising replacing the bulk semiconductor material with an insulating material that surrounds the metal.

(5) The method of any (1) to (4), wherein the forming one or more active devices comprises forming one or more of a FINFET device, a CFET device and a side-by-side-nanosheet device in the active semiconductor material.

(6) The method of any (1) to (5), wherein the first wiring structure includes a power delivery network and the second wiring structure includes a signaling network.

(7) The method of any (1) to (6), wherein the bulk semiconductor material and the active semiconductor material form a monocrystalline structure.

(8) The method of any (1) to (7), wherein the bulk semiconductor material is silicon and the active semiconductor material is silicon.

(9) The method of any (1) to (8), wherein the first wiring structure comprises a plurality of wiring layers, the method further comprising: forming a first layer of the first wiring structure within the bulk semiconductor material; epitaxially growing additional semiconductor material over the first wiring layer; and forming a subsequent layer of the first wiring structure within the additional semiconductor material.

(10) The method of any (1) to (9), further comprising repeating steps of epitaxially growing additional semiconductor material and forming a subsequent layer of the first wiring structure within the additional semiconductor material until completing a predetermined number of wiring layers for the first wiring structure.

(11) The method of any (1) to (10), further comprising insulating the openings with dielectric prior to the filling the openings with metal.

(12) The method of any (1) to (11), further comprising a) forming the first wiring structure as a multilayer fan-in wiring structure, and b) forming the second wiring structure as a multilayer fan-out structure.

(13) The method of any (1) to (12), wherein a largest critical dimension within the first and second wiring structures is no greater than 50 nm.

(14) A system comprising a monolithic substrate comprising: a first wiring structure formed within bulk material of a semiconductor wafer; one or more active devices formed in an epitaxially grown semiconductor material above the first wiring structure; and a second wiring structure formed above the one or more active devices.

(15) The system of (14), wherein the first wiring structure includes a power delivery network and the second wiring structure includes a signal network.

(16) The system of any (14) to (15), wherein the bulk material is silicon and the epitaxially grown semiconductor material is silicon.

(17) The system of any (14) to (16), wherein the first wiring structure is a multilayer fan-in wiring structure, and the second wiring structure is a multilayer fan-out wiring structure.

(18) The system of any (14) to (17), wherein a largest critical dimension within the first and second wiring structure is no greater than 50 nm.

(19) The system of any (14) to (18), wherein the one or more active devices comprises one or more of a FINFET device, a CFET device and a side-by-side nanosheet device in the epitaxially grown semiconductor material.

(20) The system of any (14) to (19), wherein the first wiring structure is metal, and the metal is capped with a dielectric.

The invention claimed is:

1. A system comprising a monolithic substrate comprising:
a first wiring structure formed fully within bulk material of a semiconductor wafer, wherein the first wiring structure comprises a layer of patterned metal fully within the bulk material of the semiconductor wafer with air gaps above the patterned metal;
one or more active devices formed in an epitaxially grown semiconductor material above the first wiring structure; and
a second wiring structure formed above the one or more active devices.

2. The system of claim 1, wherein the first wiring structure includes a power delivery network and the second wiring structure includes a signal network.

3. The system of claim 1, wherein the bulk material is silicon and the epitaxially grown semiconductor material is silicon.

4. The system of claim 1, wherein the first wiring structure is a multilayer fan-in wiring structure, and the second wiring structure is a multilayer fan-out wiring structure.

5. The system of claim 4, wherein a largest critical dimension within the first and second wiring structure is no greater than 50 nm.

6. The system of claim 1, wherein the one or more active devices comprises one or more of a FINFET device, a CFET device and a side-by-side nanosheet device in the epitaxially grown semiconductor material.

7. The system of claim 1, wherein the first wiring structure is metal, and the metal is capped with a dielectric.

* * * * *